United States Patent [19]

Chou

[11] Patent Number: 6,013,409

[45] Date of Patent: *Jan. 11, 2000

[54] DRY PEEL-APART IMAGING PROCESS

[75] Inventor: Hsin-hsin Chou, Woodbury, Minn.

[73] Assignee: 3M Innovative Properties Company, St. Paul, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/711,492

[22] Filed: Sep. 10, 1996

[51] Int. Cl.⁷ ..................................................... G03C 11/12
[52] U.S. Cl. ................................ 430/258; 430/260; 430/7
[58] Field of Search .................................... 430/258, 260, 430/7, 14

[56] References Cited

U.S. PATENT DOCUMENTS

| | | | |
|---|---|---|---|
| 4,050,936 | 9/1977 | Takeda et al. | 96/28 |
| 4,174,216 | 11/1979 | Cohen et al. | 430/257 |
| 4,175,964 | 11/1979 | Uchida et al. | 430/253 |
| 4,247,619 | 1/1981 | Cohen et al. | 430/253 |
| 4,249,011 | 2/1981 | Wendling | 548/312 |
| 4,262,072 | 4/1981 | Wendling et al. | 130/14 |
| 4,282,308 | 8/1981 | Cohen et al. | 430/271 |
| 4,286,043 | 8/1981 | Taylor, Jr. | 430/253 |
| 4,288,525 | 9/1981 | Shepherd et al. | 430/253 |
| 4,291,114 | 9/1981 | Berggren et al. | 430/253 |
| 4,304,836 | 12/1981 | Cheema et al. | 430/252 |
| 4,306,954 | 12/1981 | Wendling et al. | 204/159.22 |
| 4,323,591 | 4/1982 | Wendling et al. | 427/53.1 |
| 4,347,300 | 8/1982 | Shimazu et al. | 430/156 |
| 4,349,620 | 9/1982 | Cyr et al. | 430/259 |
| 4,482,625 | 11/1984 | Namiki et al. | 430/143 |
| 4,489,153 | 12/1984 | Ashcaoft et al. | 430/253 |
| 4,489,154 | 12/1984 | Taylor, Jr. | 430/253 |
| 4,511,641 | 4/1985 | Busman et al. | 430/158 |
| 4,551,408 | 11/1985 | Mino et al. | 430/141 |
| 4,596,757 | 6/1986 | Barton et al. | 430/257 |
| 4,634,652 | 1/1987 | Barton | 430/156 |
| 4,650,738 | 3/1987 | Platzer et al. | 430/143 |
| 4,656,114 | 4/1987 | Cederberg et al. | 430/253 |
| 4,748,101 | 5/1988 | Barton | 430/160 |
| 4,751,166 | 6/1988 | Platzer et al. | 430/160 |
| 4,808,508 | 2/1989 | Platzer | 430/143 |
| 4,910,120 | 3/1990 | Platzer et al. | 430/253 |
| 4,923,780 | 5/1990 | Taylor, Jr. | 430/257 |
| 4,923,860 | 5/1990 | Simons | 503/227 |
| 4,929,532 | 5/1990 | Dunder | 430/143 |
| 4,952,482 | 8/1990 | Barton et al. | 430/325 |
| 4,962,081 | 10/1990 | Harrison et al. | 503/227 |
| 4,963,462 | 10/1990 | Wilczak | 430/143 |
| 4,965,242 | 10/1990 | DeBoer et al. | 503/227 |
| 4,975,410 | 12/1990 | Weber et al. | 503/227 |
| 4,987,051 | 1/1991 | Taylor, Jr. | 430/253 |
| 5,001,036 | 3/1991 | Choi | 430/271 |
| 5,008,174 | 4/1991 | Platzer | 430/143 |
| 5,073,534 | 12/1991 | Harrison et al. | 503/227 |
| 5,089,372 | 2/1992 | Kirihata et al. | 430/167 |
| 5,156,938 | 10/1992 | Foley et al. | 430/200 |
| 5,166,126 | 11/1992 | Harrison et al. | 503/227 |
| 5,171,650 | 12/1992 | Ellis et al. | 430/20 |
| 5,234,790 | 8/1993 | Lang et al. | 430/253 |
| 5,248,583 | 9/1993 | Lundquist et al. | 430/263 |
| 5,256,506 | 10/1993 | Ellis et al. | 430/20 |

(List continued on next page.)

FOREIGN PATENT DOCUMENTS

| | | |
|---|---|---|
| 0 096 572 A2 | 12/1983 | European Pat. Off. . |
| 0 115 446 A2 | 8/1984 | European Pat. Off. . |
| 0 323 191 A2 | 7/1989 | European Pat. Off. . |
| 0 365 356 | 4/1990 | European Pat. Off. . |
| 0 365 357 | 4/1990 | European Pat. Off. . |
| 0 385 466 A2 | 9/1990 | European Pat. Off. . |
| 0 413 863 A1 | 2/1991 | European Pat. Off. . |
| 0 437 015 A2 | 7/1991 | European Pat. Off. . |
| 0 601 760 A2 | 6/1994 | European Pat. Off. . |
| 0 643 332 | 3/1995 | European Pat. Off. . |
| 41 25 723 A1 | 2/1993 | Germany . |
| 5-142411 | 6/1993 | Japan . |
| 5-188591 | 7/1993 | Japan . |
| 6-67421 | 3/1994 | Japan . |
| 6-194514 | 7/1994 | Japan . |
| 7-102176 | 4/1995 | Japan . |
| 2 129 952 | 5/1984 | United Kingdom . |
| WO 93/03928 | 3/1993 | WIPO . |
| WO 93/15438 | 8/1993 | WIPO . |
| WO 96/10215 | 4/1996 | WIPO . |
| WO 96/10216 | 4/1996 | WIPO . |

OTHER PUBLICATIONS

D'Hont et al., "Photodelamination Imaging," Research Disclosure, vol. 222, pp. 328–329, Havant Hampshire, GB (Oct. 1982).

Primary Examiner—John A. McPherson
Attorney, Agent, or Firm—William D. Miller; Robert J. Pechman

[57] ABSTRACT

The present invention describes a process for the formation of a black image on a substrate comprising the steps of:

a) providing a donor element comprising a carrier substrate, a black, pigmented photohardenable layer, and photopolymerizable adhesive layer in which the unexposed photopolymerizable adhesive layer has a viscosity at 25° C. of less than 100,000 cps, b) adhering said photopolymer adhesive layer to a first substrate, c) irradiating said photopolymer adhesive in an imagewise distribution of radiation to polymerize said adhesive in an imagewise distribution, and d) stripping said element from said first substrate leaving an imagewise distribution of said black pigmented layer secured to said substrate.

The black image formed on a substrate by the present invention comprises a substrate, an imagewise distribution of areas of cured photopolymerizable adhesive with a layer of black pigmented polymer over each area of cured photopolymer adhesive, and uncured photopolymerizable adhesive having no black pigmented material on its surface on said substrate between areas of black pigmented polymer. This process is especially useful in the formation of black matrices for color filter elements.

13 Claims, No Drawings

U.S. PATENT DOCUMENTS

| | | | |
|---|---|---|---|
| 5,258,261 | 11/1993 | Heller | 430/273 |
| 5,275,913 | 1/1994 | Lin | 430/258 |
| 5,278,023 | 1/1994 | Bills et al. | 430/201 |
| 5,300,399 | 4/1994 | Wilczak | 430/253 |
| 5,308,737 | 5/1994 | Bills et al. | 430/201 |
| 5,374,497 | 12/1994 | Kapusniak et al. | 430/254 |
| 5,374,780 | 12/1994 | Pazdirek | 174/176 |
| 5,409,799 | 4/1995 | Uytterhoeven et al. | 430/254 |
| 5,415,971 | 5/1995 | Couture et al. | 430/258 |
| 5,545,506 | 8/1996 | Wilczak et al. | 430/253 |

DRY PEEL-APART IMAGING PROCESS

BACKGROUND OF THE INVENTION

1. Field of the Invention

The present invention relates to the formation of high contrast black images on substrates by dry peel-apart imaging processes. Of particular importance to the practice of the present invention is the fabrication of a high contrast black image on a transparent substrate, particularly in a process for generating a black matrix (BM) for use on an emissive display panel such as a liquid crystal display (LCD) panel, most importantly for use in the manufacture of a color filter (CF) for a (flat panel) display device.

2. Background of the Art

Display devices, and particularly flat panel display devices such as those using emissive arrays such as liquid crystal panels, require the use of a color filter layer to form the desired image to be viewed from the display. A color filter, in its simplest description, is a fixed image of color through which light is passed to display the image when desired. The actuality of the color filter is more complex, with multiple requirements of high image resolution, sharp image features, physical durability and light stability of the image, often static resistance, and also thermal resistance being needed. The color filter has traditionally been constructed of a black matrix (a black border) which outlines and separates the color portions of the image) and the color portions of the image through which light is passed to project the image, the light often being generated by a radiation emitter such as a liquid crystal display, phosphor display, and the like. The black matrix has been important because it acts to separate colors so that they do not mix or blend and so that sharp image features can be presented. It also prevents white light from leaking through the separation between color elements, thereby maintaining high color saturation in the display. The function of the black matrix requires that the lines are even, sharp and have high resolution and image density so that colors laid down next to (and often slightly overlapping) the black matrix lines do not appear in the projected image.

One method of making colored images upon a non-photosensitive base uses laser induced colorant transfer or laser induced mask production. A donor element is induced (as by ablative levels of radiation) to transfer donor color material to a receptor surface. The donor may contain radiation or thermally sensitive materials to enhance the efficiency of transfer, or the donor material may be ablated without additional materials. Examples of this type of imaging process includes U.S. Pat. Nos. 5,156,938, 5,171,650, 5,256,506, and 5,089,372. The first three patents generally refer to producing a pattern of intelligence.

U.S. Pat. No. 5,171,650 particularly discloses methods and materials for thermal imaging using an "ablation-transfer" technique. The donor element for that imaging process comprises a support, an intermediate dynamic release layer, and an ablative carrier topcoat. The topcoat carries the colorant. The dynamic release layer may also contain infrared-absorbing (light to heat conversion) dyes or pigments. The pigments also include black copper as an additive. Nitrocellulose is disclosed as a possible binder.

Copending U.S. application Ser. No. 07/855,799 discloses ablative imaging elements comprising a substrate coated on a portion thereof with an energy sensitive layer comprising a glycidyl azide polymer in combination with a radiation absorber. Demonstrated imaging sources included infrared, visible, and ultraviolet lasers. Solid state lasers were disclosed as exposure sources, although laser diodes were not specifically mentioned. This application is primarily concerned with the formation of relief printing plates and lithographic plates by ablation of the energy sensitive layer. No specific mention of utility for thermal mass transfer was made.

U.S. Pat. No. 5,308,737 discloses the use of black metal layers on polymeric substrates with gas-producing polymer layers which generate relatively high volumes of gas when irradiated. The black metal (e.g., aluminum) absorbs the radiation efficiently and converts it to heat for the gas-generating materials. It is observed in the examples that in some cases the black metal was eliminated from the substrate, leaving a positive image on the substrate. This type of system, with or without the gas generating polymer, has been suggested for use in the formation of black matrix materials, by transfer or ablation.

U.S. Pat. No. 5,278,023 discloses laser-addressable thermal transfer materials for producing color proofs, printing plates, films, printed circuit boards, and other media. The materials contain a substrate coated thereon with a propellant layer wherein the propellant layer contains a material capable of producing nitrogen ($N_2$) gas at a temperature of preferably less than about 300° C.; a radiation absorber; and a thermal mass transfer material. The thermal mass transfer material may be incorporated into the propellant layer or in an additional layer coated onto the propellant layer. The radiation absorber may be employed in one of the above-disclosed layers or in a separate layer in order to achieve localized heating with an electromagnetic energy source, such as a laser. Upon laser induced heating, the transfer material is propelled to the receptor by the rapid expansion of gas. The thermal mass transfer material may contain, for example, pigments, toner particles, resins, metal particles, monomers, polymers, dyes, or combinations thereof. Also disclosed is a process for forming an image as well as an imaged article made thereby.

A series of patents (U.S. Pat. Nos. 4,965,242, 4,962,081, 4,975,410, 4,923,860, 5,073,534, and 5,166,126) have been assigned to Kodak disclosing the use of thermal dye diffusion transfer to make filter elements and color filter constructions. U.S. Pat. Nos. 4,965,242 and 5,073,534 teach the use of high $T_g$ polycarbonate and polyester receiving layers to accept the thermally transferred dye. With both receiving layers, a vaporous solvent treatment is required to drive the dye into the receiving layer.

U.S. patent application Ser. No. 08/273,419, relates to a process of forming a black matrix with a color filter element within the matrix. The process may generally involve the following steps:

1) provide a light transmissive substrate having a thermally transparentizable (e.g., any process which generates heat to remove materials, including photochemical processes in which irradiation causes chemical changes which effectively transparentize the coating) black coating thereon, 2) projecting radiation against said black coating to transparentize black coating on said substrate, said transparentization creating areas on said substrate which are more light transmissive than areas where black coating has not been transparentized, and 3) transferring one or more pigment layers onto at least some of said areas which are more light transmissive to create a black matrix/color filter element.

WO 96/10215 (PCT/EP95/03423) describes a method for the formation of a negative color image comprising the following steps in order:

(A) providing a photosensitive element comprising a transparent support, a subbing layer, a photosensitive layer comprising (polymeric binder, colorant, photoinitiator system, and photopolymerizable ethylenically unsaturated monomer, with the weight ration of monomer/binder being at least 4:1), and an adhesive layer comprising a thermoplastic polymer with a $T_g$ between 20° C. and 100° C., (B) either (i) providing a receiver base and laminating the receiver base at elevated temperature to the adhesive layer and then imagewise exposing the photosensitive layer, or (ii) imagewise exposing said photosensitive element to actinic radiation, and then providing a receiver base and laminating the receiver base at elevated temperature to the adhesive layer, (C) peeling apart said transparent layer and said receiver base whereby the adhesive layer and the imagewise exposed areas of said photosensitive layer are transferred to the receiver base. Steps (A) through (C) may be repeated to provide multicolor images.

WO 96/10216 shows processes similar to those of WO 96/10215 except that by control of the monomer to binder ratio, either positive or negative images may be transferred to a receiver base.

UK Patent Application GB 2 129 952 A describes a peel imaging system comprising a first carrier sheet, a photopolymerizable layer (containing a non-attenuating, non-photosensitive dye or pigment and contains material which changes color when exposed to actinic radiation), and a second carrier sheet, at least the first carrier sheet being transparent or translucent, the photopolymerizable layer both polymerizing and changing color upon exposure to actinic radiation. After peeling apart of the carrier, the photopolymerizable material shears along the edges of the imaged areas so that exposed areas of the photopolymerizable layer remain on the first carrier sheet.

U.S. Pat. No. 4,288,525 describes a photosensitive material which may be used in peel-apart imaging processes, particularly in the formation of dry transfer materials, resist masks, printing plates and silk screen stencils. The imaging material consists of two carrier sheets which may be peeled apart and which are laminated together via at least two interlayers (a photosensitive layer and an image forming layer). Prior to exposure, if the carrier sheets are peeled apart, the carrier sheet adjacent the photosensitive layer separates wholly from it, leaving both photosensitive layer and image forming layer on the other carrier sheet. After exposure, if the sheets are peeled apart, the whole of the photosensitive layer and at least part of the image forming layer (according to its imagewise exposure) remains attached to the carrier sheet adjacent the photosensitive layer. By incorporating adhesive in or adjacent the shearable image forming layer, the photosensitive material may constitute a material from which dry transfers may be manufactured simply by exposure and peeling apart.

EPO Application No. EP 0 323 191 A2 describes a peel-apart imaging material useful in image transfer processes. The imaging material comprises a substrate and a photosensitive layer, the photosensitive layer (as two or more layers) comprising a dye or pigment and a photopolymerizable compound. The dye or pigment is contained in at least one of these two or more layers, but is absent from the layer in direct contact with the substrate. Upon imagewise exposure of the image forming material, the exposed and unexposed areas differ in their adhesion to a receptor and image transfer occurs through a breakaway separation within the layer in direct contact with the substrate.

WO 93/03928 describes peel-apart elements for laser induced thermal imaging processes, the elements comprising, in order, a support, an active layer (infrared absorbing material, and polymeric binder), an adhesive layer, and a cover sheet. The adhesive interrelationship between layers are such that upon peeling the layers apart, regions of the active layer exposed with infrared radiation adhere to the support while exposed regions adhere to the adhesive layer and the cover sheet, forming a negative image and a positive image on the respective sheets.

EPO Applications 0 096 572 A2; 0 385 466 A2; and 0 601 760 A2 and U.S. Pat. Nos. 4,050,936; 4,347,300; 4,291,114; 5,001,036; 5,234,790; 5,300,399; and 5,374,780 also describe peel-apart photosensitive imaging systems with adhesive layers.

SUMMARY OF THE INVENTION

The present invention describes a method of fabricating a black image, especially a black matrix for a color filter element to be used in a display panel. In particular, black matrices for use in emissive arrays such as liquid crystal displays are manufactured by the materials and process of the present invention.

The donor element used in the practice of the present invention comprises in the following order:

a) a carrier layer, b) a pigmented black color photohardenable layer (referred to herein as the "PPa" layer), c) a photopolymeric adhesive layer (referred to herein as a "PPl" layer), and an optionally preferred strippable liner layer. The viscosity of the unexposed photopolymer adhesive layer must be below 100,000 cps at 25° C. (if the lamination and peel apart process is performed at that temperature, or below that 100,000 limit at the temperature at which the lamination and peel apart process is actually performed, e.g., up to 50 degrees Centigrade) to avoid premature delamination of the PPa layer from the carrier layer.

The photopolymer adhesive layer is adhered to a receptor substrate, the adhesive is imagewise exposed to radiation through the carrier and pigmented layer to which the photosensitive layer is sensitive, by using the relatively low viscosity adhesive on the receptor sheet, a negative image is formed on the receptor which has high resolution and strong adherence to the receptor. Sharp lines of less than 40 micrometers in line width can be readily attained.

DETAILED DESCRIPTION OF THE INVENTION

Black matrices used in emissive displays can be critical to the overall performance of the display panel. The individual lines of the matrix define the sharp edges of the windows into which the colorant is deposited for the color filter element. Properties such as contrast, resolution, definition, and aperture ratio for the color filter can be determined at least in part by the black matrix. The black matrix is especially important in active matrix liquid crystal displays. Black matrices of a high light shield factor (high optical density) are particularly desirable to prevent light leaks. The minimum required optical absorbance (transmission optical density) is 2.5–3.0. Chromium/Chromium oxide bilayers have been the most commonly used black matrix material in the industry, but because of the cost associated with wet microphotolithography, the industry has attempted to replace the material with organic pigments matrices, but to date with little commercial success. The present construction and process enables the production of a high resolution, high optical density, firmly adhered black matrix for use in color filters with a peel-apart manufacturing process.

There are at least three layers used in the construction of the black matrix peel-apart element used in the practice of the present invention. That element comprises a carrier substrate, black pigmented photohardenable (photopolymerizable) layer, and photopolymerizable adhesive layer.

Carrier Layer

The carrier layer comprises a flexible film layer, preferably a flexible organic polymeric film layer, more preferably a near UV (0.30 to 0.4 micrometer) transparent/translucent organic polymeric film layer. Conventional polymeric film forming materials may be used in the selection of these carrier layers. such materials as polyesters (e.g., polyethyleneterephthalate, polyethylenenaphthalate), polystyrene, polycarbonates, polyimides, polyolefins (e.g., polyethylene and polypropylene), cellulosic films (e.g., cellulose triacetate, cellulose acetate butyrate), vinyl resins (e.g., vinyl chloride, vinylidene chloride) and the like may be used, with polyesters, and especially polyethylene terephthalate (PET) as the film material of choice.

Black Pigmented Photohardenable Layer

The black pigmented photohardenable layer comprises an organic photohardenable binder with black pigment, and preferably a combination of two or more (e.g., 2, 3, 4 or 5) pigments which absorb at wavelengths which produce a black layer with the desired tone qualities for a matrix forming material. It is particularly desirable that the black matrix forming pigment containing layer have a visible transmission optical density (on the carrier layer, which is then transferred to the receptor layer) of at least 2.5, preferably more than 3.0, more preferably at least 3.5. The pigment may be carbon black (alone or with other pigments to lower density at the UV exposure region or adjust the tone of the carbon black), metal/metal oxide mixtures, or more preferably, mixtures of two, three or four organic pigments which form a black pigmentation in the binder. Mixtures of metallic pigments and organic pigments may also be used. Mixtures of carbon black and at least two organic pigments are preferred in the practice of the present invention. Some dye may be used in the pigmented layer, but dyes tend to be undesirable from the standpoint of migration into the photopolymer adhesive layer. Because some adhesive is left on the receptor surface after stripping, some undesirable dye coloration would also be left when dye migrates into the photopolymer adhesive layer.

The black pigmented layer may have a thickness between 0.5 and 50 micrometers, preferably between 0.5 and 10 micrometers, and more preferably between 0.5 and 5 micrometers, as long as the optical density of the layer is provided by the thickness and content of that layer. Preferred binder components of that layer are ethylenically unsaturated monomers, oligomers and polymers. Most preferable are the (meth)acryloyl polymerizable materials with or without copolymerizable components). The (meth) indicating that the polymerizable materials may be methacrylic or acrylic materials. preferred polymerizable materials comprise at least some poly(meth)acryloyl materials with 2, 3, 4, 5, or six or more ethylenically unsaturated (meth)acryloyl groups on a monomer. Mixtures of (meth) acryloyl and copolymerizable materials may be used. Resins having a $T_g$ between 30° C. and 150° C., including copolymers of acrylic and/or methacrylic monomers with styryl monomers may be used. Useful resins include polymers and copolymers of acrylic acid, methacrylic acid, methyl acrylate, ethylacrylate, methyl methacrylate, n-butyl methacrylate, n-butylisobutyl methacrylate, polyvinylacetates and polystyrenes. Latexes may also be used, but due to the presence of the emulsifiers there may be a tendency to attack the adjacent photosensitive layer, so special care in the selection must be taken. The styrene/acrylate resins having a $T_g$ between 45° C. and 60° C. may form brittle films when formulated by themselves, so flexibilizers or the like may be desirable. These monomers may be blended with more highly functional materials such as the compounds of U.S Pat. No. 4,249,011; 4,262,072; and 4,306,954 which are air stable (reduced oxygen sensitivity) acrylic substituted heterocyclic compounds including 1,3-bis-[2,2,2-(triacryloyloxymethyl)ethoxy-2-hydroxypropyl]-5,5-dimethyl-2,4-imidizolidinedione (referred to as hydantoin hexaacrylate). Other additives or comonomers may include such materials as polyacrylic or polymethacrylic acid esters of polyhydric alcohols including for example di(meth) acrylic acid esters of aliphatic diols such as ethyleneglycol, triethyleneglycol, 2,2-dimethyl-1,3-propanediol, 1,3-cyclopentanediol, the tri(meth)acrylic esters of aliphatic triols such as glycerin, 1,2,3-propanetrimethanol 1,2,5-pentanetriol, 1,3,6-hexanetriol, tetra(meth)acrylic esters of alipahtic triols such as 1,1,3,3-tetramethylolpropane and pentaerythritol tetraacrylate, and the penta- and hexa- counterparts of these compounds. The black pigment may have tones to it which modify or soften the black color (e.g., blue-black, brown-black, etc.), but the pigment(s) must provide an image that is considered black within the art.

Photopolymerizable Adhesive Layer

Polymerizable materials similar to those described for the pigmented photosensitive layer of the present invention may also be used within this layer as long as the viscosity of the photopolymerizable adhesive layer is less than 100,000 cps at 25° C. (or at whatever temperature the lamination and peel apart process is performed, usually at a maximum temperature of 50 degrees Centigrade). The viscosity of this layer is measured by Brookfield or Haake rheometers. The photosensitizers used within the photosensitive layers may be selected from amongst those photosensitizers well known within the photopolymerization and photoinitiation art and include, but are not limited to free radical photoinitiators such as diaryliodonium salts, triarylsulfonium salts, s-triazines, acyloin and derivatives thereof e.g., benzoin, benzoin methyl ethers, diketones, such as benzil and diacetyl, phenones such as acetophenone, 2,2,2-tribromo-1-phenylethanone, 2,2-diethoxyacetophenone, benzophenone, and the like.

These and other non-limiting aspects of the present invention will be further described in the following examples.

One of the problems which needed to be addressed by the practice of the present invention is a result of the fact that NOA (a brand name of Norland Products, Inc. for photoadhesives believed to be of the thiol-ene polymer family) is thermally unstable, at least in part because it is a thermally curable system. Furthermore since NOA is a thiol-ene based photopolymer, it tends to interact with HHA (hydantoin hexaacrylate, as described in U.S. Pat. No. 4,323,591, compound 1) and therefore makes the NOA/HHA mixture somewhat unstable. The earlier examples using NOA/HHA mixture for pigment dispersions and PP1 for the clear laminating photopolymer are satisfactory for establishing utility and for demonstrations, but are not the best combinations for commercialization of the technology. The colorant layer and PP1 coatings as well as the dispersions and solutions do not have adequate shelf life for significant product feasibility.

The following examples use other photopolymers to demonstrate that the concept of the present invention works for most photopolymers and that greater stability can be achieved. The important considerations for choosing the right photopolymers are (1). the photopolymer PPa in the colorant layer has to have low adhesion to the PET carrier substrate after photocure, and (2). the photopolymer PP1 has to have the proper viscosity during the release liner peel-away and final BM peel-apart processes to prevent premature delamination or poor BM structure definition.

Photopolymer solution HHA* is obtained by mixing HHA (Hydantoin Hexaacrylate, 3M) with Irgacure™ 369 (ICI) photoinitiator in 10 to 0.25 ratio to a 10% solid solution in MEK. Pigment yellow 17 (Diarylide AAOA yellow), Pigment blue 15:3 (Phthalocyanine blue GS), pigment red 57:1 (Rubine) and carbon black (Regal 300R) are each dispersed in 1/1 ratio into portions of the photopolymer solution A with appropriate surfactants into the photopolymer solution. The surfactants used were Solsperse™ 17000 and 22000 (4 to 1 ratio) for cyan, Solsperse™ 17000 and 5000 for yellow, Solsperse™ 17000 only for magenta pigment and Solsperse™ 24000 and 5000 for black. Surfactant to pigment ratio was 10 to 1. The mitre was then ball milled with glass beads overnight to yield the four separate pigment color dispersions.

Unless otherwise specified, the materials and tools used are listed below.
Donor substrate: Plain 1 mil PET.
Receptor: sputter-etched PET films.
Photomask: 1. A Cr BM (Chromium Black Matrix) on 1.1 mm sodium lime glass made by IGI (Infinite Graphic Inc., MN) unless specified otherwise. The OD (reflection optical density) on the black field is 3.0. The Cr rectangles have areas of 70 $\mu \times 290\ \mu$. They are separated in both horizontal and vertical direction by 40 $\mu$gm.
2. A high contrast AgX Ugra resolution target film.
Exposure unit: Ascor 2 kW UV exposure printer which has a nominal power density of 57 mW/cm$^2$ at 0.369 $\mu$.

EBC materials used in the Examples are brand names of Radcure, UCB Chemicals, and include polyester acrylates (EBC 81, EBC 40, EBC 1810, EBC 80, and EBC 2870), Acrylated epoxies EBC 605, EBC 3605, and EBC 3701), aliphatic urethanes (EBC 8402 and EBC 230) and polyacrylates (EBC 1701).

EXAMPLE 1
Colorant layer: Pigment/HHA*, 1/1, 12% wt #4 Meyer bar.
Cyan OD=1.2, Magenta OD=1.1
PP1 layer: [EBC3200/HHA, 1/1]/Irgacure 369, 10/0.5, 10% wt, #6.
Exposure time: Cyan; 13 seconds, Magenta; 5 seconds.
Results: Good edge definition was obtained for the BM image for each color. The resolution is 12$\mu$ for both positive and negative fields print.

EXAMPLE 2
Colorant layer: same as Example 1, Cyan only. PP1 layer: [EBC1810/HHA, 1/1]/Irgacure 369, 10/0.25, 10% wt, #6.
Exposure time: Cyan; 11 seconds
Results: Good edge definition was obtained for the BM image for each color. The resolution is 12$\mu$ for both positive and negative fields print.

EXAMPLE 3
Colorant layer: Pigment/HHA*, 2/1, 12% wt #4 Meyer bar.
Cyan OD=1.79, Magenta OD=1.24, yellow; OD=0.8
PP1 layer: [EBC3200/HHA, 1/1]/Irgacure 369, 10/0.25, 10% wt, #6.
Exposure time: Cyan; 35 seconds, Magenta; 2.2 seconds
BM mask3: A 0.9mm sodium lime glass Samsung BM with 25$\mu$ linewidth was used.
Results: Good reproduction of the BM with excellent edge definition was obtained for the BM image of each color. The resolution is 12 $\mu$ for both positive and negative fields print.

EXAMPLE 4
Colorant layer: Carbon black/HHA (with 1.25% Irgacure 369 to photopolymer), 1/1, 10.6% wt #4 Meyer bar. OD=1.05. The Carbon black/HHA, 2/1 mixture was ball milled overnight before subjected to a jet milling process at up to 20 k lb/in$^2$ pressure. The dispersion was then passed through a 1$\mu$ filter.
PP1 layer: [EBC3200/HHA, 1/1]/Irgacure 369, 10/0.25, 10% wt, #6.
Exposure time: 35 seconds.
BM mask3: A 0.9 mm sodium lime glass Samsung BM with 25$\mu$ linewidth was used.
Results: Good reproduction of the BM with excellent edge definition was obtained for the BM image of each color. The resolution is _12$\mu$ for both positive and negative fields print.

EXAMPLE 5
Colorant layer: 3-color Pigment black/HHA*, 18/7, 13.6% wt #6 Meyer bar.
   Pigment; Cyan/Magenta/Yellow, 5/5/4
PP1 layer: [EBC3200/HHA, 1/1]/Irgacur 369, 10/0.25, 10% wt, #10.
Exposure time: 70 seconds using mask 3 (40 seconds with a Photronic quartz mask)
BM mask 3: A 0.9 mm sodium lime glass Samsung BM with 25$\mu$ linewidth was used.
BM mask 4: The Photronic mask, same as mask 1 except that the substrate is a 1.1 mm quartz plate.
Results: Good reproduction of the BM with excellent edge definition was obtained for the BM image of each color. The edge sharpness is within+/−2$\mu$.

EXAMPLE 6
Colorant layer: Carbon black /HHA*, 11/6.5 (Preparation same as example 4), 10.8% wt #4 Meyer bar. OD=1.55
PP1 layer: HHA/Irgacure™ 369, 10/1, 10% wt, #6.
Exposure time: 5 seconds, using BM mask 4
Results: Good reproduction of the BM with excellent edge definition was obtained for the BM image of each color. The edge sharpness is within+/−2$\mu$.

EXAMPLE 7
Colorant layer: Carbon black/HHA, 3/1 [Regal 300R carbon black powder was sand mill-dispersed in toluene with 15% wt Solsperse™ 24000 and 3.75% wt Solsperse 5000 (to the pigment). The mixture was continuously sand milled for 2½ hours in an Eiger sand mill using zirconium/silicate sand. HAA* was then added to yield the right proportion], 10.8% wt #4 Meyer bar. OD=2.0.
PP1 layer: (HHA/EBC40, 2/1)/Irgacure 369, 10/1, 10% wt, #6.
Exposure time: 6.5 seconds, using BM mask 4 using a 5 kW Consolux™ exposure unit made by Burgess Industries, Inc. (Plymouth, Minn.).
Results: Good reproduction of the BM with excellent edge definition was obtained for the BM image of each color. The edge sharpness is within +/−2$\mu$.

EXAMPLE 8
Colorant layer: Green PG36/CN963A80*, 2/1 [PG36 green pigment was sand mill-dispersed in MEK with 6% wt Solsperse™ 28000 (to the pigment). The mixture was continuously sand milled for 2 ½ hours in an Eiger sand mill using zirconium/silicate sand. CN963A80* was then added to yield the right proportion], 10% wt #4 Meyer bar. OD=1.3

*CN963A80 is a blended photopolymer with 70–90% urethane acrylate oligomer and 10–30% Tripropylene Glycol Diacrylate by Sartomer Co., Inc. (Exton, Pa).

PP1 layer: (HHA/EBC40, 2/1)/Trgacure™ 369, 10/1, 10% wt, #6.

Exposure time: 3 seconds, using a color filter (CF) quartz mask with 90μ strip windows made by Photronic and using a 5 kW Consolux ™ exposure unit made by Burgess Industries, Inc. (Plymouth, Minn.).

Results: Good reproduction of the color filter elements (strips) with excellent edge definition was obtained for the CFE image of each color. The edge sharpness is within +/−1μ.

EXAMPLE 9

This example is to demonstrate the importance of viscosity of PP1 and to set an upper limit of viscosity for our imaging application. No exposures were performed. The donor with colorant layer and various PP1 layer was peeled apart from the receptor right after lamination to determine whether pre-mature delamination took place. EBC is a brand name of Radcure, UCB Chemicals, Inc for its photochemical products.

| Photo-polymer | Viscosity (cps) @ 25° C. | Premature De-lamination |
|---|---|---|
| EBC 81 | 100 | No |
| EBC 40 | 175 | No |
| EBC 1810 | 550 | No |
| EBC 3200 | 2250 | No |
| EBC 80 | 3000 | No |
| EBC 605 | 7000 | No |
| EBC 8402 | 15000 | No |
| EBC 230 | 40000 | No |
| EBC 2870 | 70000 | No |
| EBC 3605 | 150000 | Yes |
| EBC 1701 | 560000 | Yes |
| EBC 3701 | >1MM | Yes |

Colorant layer: Carbon black/HHA * (2.5% wt Irgacure 369 to the photopolymer), 3/1 [Regal 300R carbon black powder was sand mill-dispersed in Toluene with 15% wt Solsperse™ 24000 and 3.75% wt Solsperse™ 5000 (to the pigment). The mixture was continuously sand milled for 2 ½ hours in an Eiger sand mill using zirconium/silicate sand. HAA was then added to yield the right proportion], 10.8% wt #4 Meyer bar. OD=2.0

It is observed that 70,000 cps @ 25° C. (or at the actual temperature at which the lamination and peel apart process is performed) is a marginal viscosity for PP1 for our peel-apart system before premature delamination taking place, which is estimated at below 100,000 cps, preferably below 90,000 cps, and more preferably below 80,000 cps at 25° C. (or at the actual temperature at which the lamination and peel apart process is performed).

The curable PP1 layer maybe applied as liquid coating compositions which are dried to a sufficiently stable condition to allow movement of photopolymer to laminate to the receptor without extreme flow of the coating off of the carrier. The photopolymer layer maybe be in a solid state as in a dry film photoresist layer, which can be adhered to the receptor through lamination at modest temperatures, exposed through a mask at room temperature and peeled apart at slightly elevated temperature, at which the viscosity of the unexposed photopolymer is less than 70,000 cps.

The process of the present invention may be alternatively practiced by coating the low viscosity photopolymerizable adhesive layer onto the final receptor surface and then dry laminating the black pigment containing layer (with strippable carrier layer) onto the coated receptor. The imaging and stripping process of the present invention may then be performed.

EXAMPLE 10

Experimental results using photolithographic peel-apart technique and clear photopolymer.

Photopolymer solution A is obtained by mixing a NOA 81 optical grade, photocurable adhesive (Norland Products Inc.) with HHA solution* (Hydantoin Hexaacrylate/Irgacure 369, 10/0.5, 3M in a 1/1 ratio to a 10% solid solution in MEK. Pigment yellow 17 (Diarylide AAOA yellow), Pigment blue 15:3 (Phthalocyanine blue GS) and pigment red 57:1 (Rubine) were mixed in 1/1/1 ratio with appropriate surfactants into the photopolymer solution such that the pigment/binder ratio was 1/1. The surfactants used were Solsperse 17000 and 22000 (4 to 1 ratio) for cyan, Solsperse 17000 and 5000 for yellow and 17000 only for magenta pigment. Surfactant to pigment ratio was 10 to 1. The mixture was then ball milled with glass beads overnight to yield the pigment black dispersion.

The mixture was then further diluted with Toluene/MEK (4/1) solvent to a 12% wt coated on a 1 mil PET using a #6 Meyer bar. The film was then oven dried for 1 minute at 80° C. after air drying at room temperature (RT). The photopolymer solution A was then used to overcoat the pigmentlbinder layer with a photopolymer layer using a #4 Meyer bar. The composite film was then air dried and oven dried again as before. The composite film was then cold laminated onto a 4 mil plain PET film (which served as a release liner) using a 3M 1147 laminator.

To simulate imaging on to an epoxy silane coated glass plate for actual black matrix application, a plasma etched PET film was used for demonstration. Before imaging, the 4 mil PET film on the laminated composite film was peeled away and the composite film was then relaminated onto the etched film. The rest of the element was subjected to exposure and peel-apart to generate a black matrix (3M) on the etched film. The UV exposure was carried out using an ASCOR exposure unit which has a nominal UV intensity of 5.5 mW/cm$^2$. The exposure time was 130 seconds. The original "negative" mask is a Cr BM made by IGI(Infinite Graphic Inc., Minn.). The OD on the black field is 3.0. The Cr rectangles have areas of 70μ×290μ. They are separated in both the horizontal and vertical directions by 40 μm.

The Black Matrix (BM) so generated has sharp edges at its windows. The irregularity at the edge is 1μ. The optical density on the black field is 1.0.

EXAMPLE 11

This example is similar to Example 10 except that the clear photopolymer solution was coated on a 4 mil PET release liner and then cold laminated onto the pigment/photopolymer layer on the donor substrate. The reason for this experiment was to eliminate scratches generated on the pigment layer in Example 10 during Meyer bar overcoating. In actual continuous coating when non-contact coating techniques are used where there are no relative motion between the web and coating head, such as gravure coating are used, process described in Example 10 is still viable and may be a preferred technique for donor coating.

EXAMPLE 12

Same as example 11 except that only a magenta dispersion was used as colorant layer. Magenta pigment had a better dispersion when Solsperse 3000 hyperdispersant was used as surfactant. The colorant layer was coated with 12% solid dispersion using a #4 Meyer bar. The clear photopolymer overcoat was made with 10% solution using #10 Meyer bar.

The receptor is a silane treated glass plate. A cleaned glass plate was dip-coated with a 5% A187 solution in MEK (A187 is 3-Glycidoxypropyltrimethoxysilane) and blow dried to obtain a very thin coating. The glass plate was then oven dried at 80° C. for 3 minutes. The rest of the process is the same as in Example 11. Exposure time was only 3.7 seconds. This is due to the fact that magenta pigment does not absorb in the UV range. Good adhesion of magenta BM to the glass plate was obtained. The quality is similar to that of Example 10.

In the process of the present invention for the formation of a black image on a substrate, one provides a donor element comprising a carrier substrate, a black pigmented photohardenable layer, and photopolymerizable adhesive layer in which the unexposed photopolymer has a viscosity at 25° C. of less than 100,000 cps, then adheres said photopolymer adhesive layer to a first substrate, with subsequent irradiation of said photopolymer adhesive in an imagewise distribution of radiation to polymerize said adhesive in an imagewise distribution, and then stripping said element from said first substrate leaving an imagewise distribution of said black pigmented layer secured to said substrate. This process leaves an identifiable footprint of the process. The final image comprises the receptor surface, with relief areas of cured adhesive layer and pigment layer, and in between these relief areas are areas of uncured (or subsequently cured) adhesive material in a thickness which is less than the thickness of the adhesive layer in the relief areas. This thinner region of adhesive (which is less than 75%, more usually less than 50%, and most often less than 25% the thickness of adhesive remaining underneath the black pigmented layer imagewise distributed on said receptor) occurs because of the splitting of the liquid adhesive layer during the stripping process. In the last stripping step described in the process of this invention, the adhesive layer is thus split between the strippable (carrier layer) and the receptor surface.

The article produced by this process would be a black image on a substrate comprising a substrate, an imagewise distribution of areas of cured photopolymerizable adhesive with a layer of black pigmented polymer over each area of cured photopolymer adhesive, and uncured photopolymerizable adhesive having no black pigmented material on its surface on said substrate between areas of black pigmented polymer. The black image would preferably have said uncured photopolymerizable adhesive with a thickness which is less than 75% of the thickness of said cured photopolymerizable adhesive.

After the donor element is stripped from the first substrate, the stripped element has remaining thereon a negative distribution of photopolymer adhesive of the imagewise distribution of the black pigmented layer which has adhered to the first substrate. The negative distribution of adhesive on the stripped element may then be used to adhere the element to a second substrate. The negative distribution of photopolymer adhesive on the stripped element may be irradiated to bond the negative distribution of photopolymer adhesive to the second substrate. The black pigmented layer on the stripped element may also be irradiated to bond the black layer to the second substrate.

What is claimed:

1. A process for the formation of a black image on a substrate comprising the steps of:

a) providing a donor element comprising a carrier substrate, a black, pigmented photohardenable layer, and photopolymerzable adhesive layer in which the unexposed photopolymerizable adhesive layer has a viscosity at 25° C. of less than 100,000 cps,
   b) adhering said photopolymer adhesive layer to a first substrate,
   c) irradiating said photopolymer adhesive in an imagewise distribution of radiation through said carrier substrate and black, pigmented layer to polymerize said adhesive in an imagewise distribution, and
   d) stripping said element from said first substrate leaving an imagewise distribution of said black pigmented layer secured to said substrate.

2. The process of claim 1 wherein said imagewise distribution of said black pigmented layer corresponds to areas which have been irradiated by said imagewise distribution of radiation.

3. The process of claim 2 wherein the viscosity of said unexposed photopolymer is less than 90,000 cps at 25° C. and said substrate is a non-birefringent transparent substrate.

4. The process of claim 2 wherein the viscosity of said unexposed photopolymer is less than 80,000 cps at 25° C.

5. The process of claim 1 wherein after said element is stripped from said first substrate, said stripped element, which has a negative distribution of photopolymer adhesive of the imagewise distribution of said black pigmented layer adhered to said first substrate remaining on said element, is adhered to a second substrate by said negative distribution of photopolymer adhesive.

6. The process of claim 5 wherein said negative distribution of photopolymer adhesive adhered to said second substrate is irradiated to bond said negative distribution of photopolymer adhesive to said second substrate.

7. The process of claim 6 wherein said black pigmented layer is also adhered to said second substrate by said irradiating to bond said negative distribution of photopolymer.

8. The process of claim 1 wherein said photopolymer adhesive layer comprises a multiacrylic functional oligomer or monomer with at least two acrylic functionalities per molecule and said imagewise distribution of said black pigmented layer forms a black matrix for a color filter.

9. A process for the formation of a black image on a substrate comprising the steps of:

a) providing a donor element comprising a carrier substrate, a black pigmented photohardenable layer, and photopolymerizable adhesive layer in which the unexposed photopolymerizable adhesive layer has a viscosity at 25° C. of less than 100,000 cps,
   b) adhering said photopolymer adhesive layer to a first substrate,
   c) irradiating said photopolymer adhesive in an imagewise distribution of radiation to polymerize said adhesive in an imagewise distribution, and
   d) stripping said element from said first substrate leaving an imagewise distribution of said black pigmented layer secured to said substrate, with photopolymerizable adhesive remaining in areas of said first substrate between said imagewise distribution of said black pigmented layer.

10. The process of claim 9 wherein said photopolymerizable adhesive remaining in areas of the first substrate between the imagewise distribution of the black pigmented layer has a thickness which is less than the thickness of adhesive underneath said imagewise distribution of said black pigmented layer.

11. The process of claim 9 wherein said photopolymerizable adhesive remaining in areas has a thickness which is less than 75% thickness of adhesive underneath said imagewise distribution of said black pigmented layer.

12. A process for the formation of a black image on a substrate comprising the steps of:
    a) providing a donor element comprising a black pigmented photohardenable layer and a carrier layer,
    b) adhering a photopolymerizable adhesive layer to a receptor surface in which the unexposed photopolymerizable adhesive layer has a viscosity at 25° C. of less than 100,000 cps,
    c) laminating the donor element onto the photopolymerizable adhesive layer on the receptor surface.
    d) irradiating said photopolymer adhesive in an imagewise distribution of radiation to polymerize said adhesive in an imagewise distribution, and
    e) stripping said carrier layer from said receptor, leaving an imagewise distribution of a cured black pigmented layer secured to said receptor, wherein the cured pigmented layer is separated by areas of uncured photopolymerizable adhesive material.

13. The process of claim 12 in which said uncured photopolynerizable adhesive is cured after formation of said black image.

* * * * *

UNITED STATES PATENT AND TRADEMARK OFFICE
CERTIFICATE OF CORRECTION

PATENT NO. : 6,013,409
DATED : January 11, 2000
INVENTOR(S) : Hsin-Hsin Chou

It is certified that error appears in the above-identified patent and that said Letters Patent is hereby corrected as shown below:

Column 7,
Line 21, "mitre" should read -- mixture --.

Column 10,
Line 27, "pigmentl" should read -- pigment/ --.
Line 39, "3M" should read -- BM --.

Signed and Sealed this

Eleventh Day of December, 2001

*Attest:*

NICHOLAS P. GODICI
*Attesting Officer*     *Acting Director of the United States Patent and Trademark Office*